(12) United States Patent
Bruno (10) Patent No.: US 9,188,634 B2
(45) Date of Patent: Nov. 17, 2015

(54) ISOLATION TESTING OF SEMICONDUCTOR DEVICES

(71) Applicant: Power Integrations, Inc., San Jose, CA (US)

(72) Inventor: Andrew W. Bruno, Gilroy, CA (US)

(73) Assignee: Power Integrations, Inc., San Jose, CA (US)

( * ) Notice: Subject to any disclaimer, the term of this patent is extended or adjusted under 35 U.S.C. 154(b) by 147 days.

(21) Appl. No.: 13/840,687

(22) Filed: Mar. 15, 2013

(65) Prior Publication Data

US 2014/0266284 A1   Sep. 18, 2014

(51) Int. Cl.
| | | |
|---|---|---|
| *G01R 31/28* | (2006.01) | |
| *G01R 31/12* | (2006.01) | |
| *G01R 1/00* | (2006.01) | |
| *G01R 1/04* | (2006.01) | |

(52) U.S. Cl.
CPC ........ *G01R 31/2863* (2013.01); *G01R 31/1227* (2013.01); *G01R 1/0408* (2013.01); *G01R 31/2879* (2013.01); *G01R 31/2886* (2013.01); *G01R 31/2889* (2013.01)

(58) Field of Classification Search
CPC ......... H01L 22/00; H01L 22/10; H01L 22/12; H01L 22/14; G01R 31/2863; G01R 31/1227; G01R 31/2879; G01R 31/2886; G01R 31/2889; G01R 1/0483; G01R 1/0408; G01R 1/07307

USPC ............ 324/754.07, 757.01, 762.01, 756.05, 324/756.02, 765, 769, 750.19; 257/678; 279/3

See application file for complete search history.

(56) References Cited

U.S. PATENT DOCUMENTS

| | | | | |
|---|---|---|---|---|
| 5,543,726 A | * | 8/1996 | Boyette et al. | 324/750.22 |
| 6,012,751 A | * | 1/2000 | Kim | 279/3 |
| 6,043,667 A | * | 3/2000 | Cadwallader et al. | 324/750.19 |
| 6,362,517 B1 | * | 3/2002 | Bell et al. | 257/678 |
| 6,660,561 B2 | * | 12/2003 | Forthun et al. | 438/109 |
| 7,151,368 B2 | * | 12/2006 | Joung et al. | 324/757.01 |
| 7,307,443 B2 | * | 12/2007 | Toh et al. | 324/756.02 |
| 7,876,115 B2 | * | 1/2011 | Stewart et al. | 324/754.07 |
| 2006/0158179 A1 | * | 7/2006 | Chyan | 324/158.1 |

* cited by examiner

*Primary Examiner* — Melissa Koval
*Assistant Examiner* — Felicia Farrow
(74) *Attorney, Agent, or Firm* — Blakely Sokoloff Taylor & Zafman LLP (57) ABSTRACT

One example apparatus for isolation testing of semiconductor devices may include an interface portion for making electrical contact with packaged semiconductor devices under test. The interface portion may include an insulating support configured and dimensioned to support multiple semiconductor device packages, each semiconductor device package having a plurality of electrical contacts. The interface portion may further include a first electrically conductive surface to electrically contact a first proper subset of the plurality of electrical contacts of each of the semiconductor device packages supported by the interface portion and a second electrically conductive surface to electrically contact a second proper subset of the plurality of electrical contacts of each of the semiconductor device packages supported by the insulating support.

24 Claims, 6 Drawing Sheets

FIG. 16

ISOLATION TESTING OF SEMICONDUCTOR DEVICES

BACKGROUND

1. Field

This disclosure relates to isolation testing of semiconductor devices.

2. Description of Related Art

Semiconductor devices can be tested to control and assure quality. Testing can also improve safety since defective semiconductor devices can be identified before deployment.

DESCRIPTION OF THE FIGURES

Non-limiting and non-exhaustive embodiments are described with reference to the following figures, wherein like reference numerals refer to like parts throughout the various views unless otherwise specified.

DETAILED DESCRIPTION

In the following description, numerous specific details are set forth in order to provide a thorough understanding. It will be apparent, however, to one having ordinary skill in the art that the specific detail need not be employed.

Figure 1:
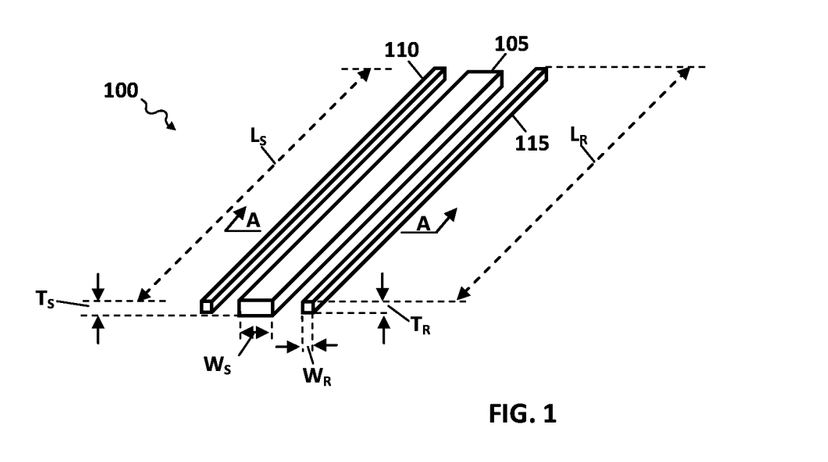
FIG. 1 is a schematic representation of an interface portion of a chuck that can be used for isolation testing of semiconductor devices.

FIG. 1 is a schematic representation of the interface portion of a chuck 100 that can be used for isolation testing of semiconductor devices. The interface portion of chuck 100 includes an insulating support 105, a first contact rail 110, and a second contact rail 115. Support 105 and contact rails 110, 115 can interface with multiple semiconductor devices to provide isolation testing in parallel.

Insulating support 105 can be a generally elongated strip-shaped member and have a length $L_S$, a width $W_S$, and a thickness $T_S$. Length $L_S$ can be several times the length of the package of semiconductor devices that are to be isolation tested in parallel using chuck 100. For example, length $L_S$ can be between two and 1000 times the length of the package, e.g., between five and 20 times the length of the package. Width $W_S$ can be chosen in accordance with the type and the width of the package of semiconductor devices that are to be isolation tested, as discussed further below. For example, in some implementations, width $W_S$ can be narrow enough that packages can easily slide along length L of insulating support 105 with lead frame members straddling insulating support 105. Thickness $T_S$ is in general large enough that insulating support 105 can mechanically support the weight of the multiple semiconductor devices that are isolation tested in parallel. Further, in some implementations, thickness $T_S$ can be thick enough to extend downwardly beyond the lead frame of certain types of packages of semiconductor devices that are isolation tested.

Insulating support 105 is made from an insulating material. Examples of suitable materials include glass, porcelain or other ceramics, polymers, and composites of these and other materials. Example of suitable porcelain materials include, e.g., clay, quartz or alumina and feldspar. Examples of suitable polymers include, e.g., polytetrafluoroethylene, silicone rubber, and ethylene propylene diene monomer rubber. In some implementations, insulating support 105 is temperature controlled so that isolation testing can be conducted at a desired temperature.

Contact rails 110, 115 can be generally elongated members and have at least one electrically conductive surface. In some implementations, the electrically conductive surface is a rigid surface. Examples of suitable rigid surfaces include solid metallic surfaces of, e.g., layers or films formed on a conducting or insulating supports or surfaces of rigid bulk conductive bodies. Examples of suitable metals include copper, silver, gold, alloys and composites thereof, as well as other metals. In some implementations, the electrically conductive surface is a flexible surface. Examples of suitable flexible surfaces include the surfaces of metal wools and polymers that conduct, e.g., due to impregnation with metallic or conducting carbon particles. Such flexible surfaces can be formed, e.g., as layers or films atop rigid bodies that conduct or insulate. In some implementations, the electrically conductive surface can be provided with surface roughness or other features to help ensure that an appropriate electrical contact with a device under test is established.

In the illustrated implementation, contact rails 110, 115 have a length $L_R$, a width $W_R$, and a thickness $T_R$. Length $L_R$ can be several times the length of the package of semiconductor devices that are to be isolation tested in parallel using chuck 100. For example, length $L_R$ can be between two and 1000 times the length of the package, e.g., between five and 20 times the length of the package. Width $W_R$ and thickness $T_R$ are generally sufficiently large enough that electrically-conducting contact rails 110, 115 can be pressed against semiconductor device packages and/or lead frame members supported on insulating support 105 to establish electrical contact.

Further, in some implementations, thickness $T_R$ may be the same as thickness $T_S$ of insulating support 105 or thinner, as shown. Such a thickness $T_R$ can help reduce the chance that an arc or other short develops between contact rails 110, 115 during testing. In some implementations, the mechanical integrity of contact rails 110, 115 is provided by an electrically conductive material. Examples of suitable materials include, e.g., copper and other metals, including composites and alloys thereof. However, this is not necessarily the case and in some implementations the mechanical integrity of contact rails 110, 115 is provided by an electrically insulating material that is coated at least in part by a rigid or flexible electrical conductor, as discussed above. In some implementations, contact rails 110, 115 are each mounted on one or more guide members (not shown). The guide members may be pivotable, slidable, or otherwise movable to guide contact rails 110, 115 into and out of electrical contact with multiple semiconductor devices that are isolation tested in parallel, as discussed further below.

Figure 2:
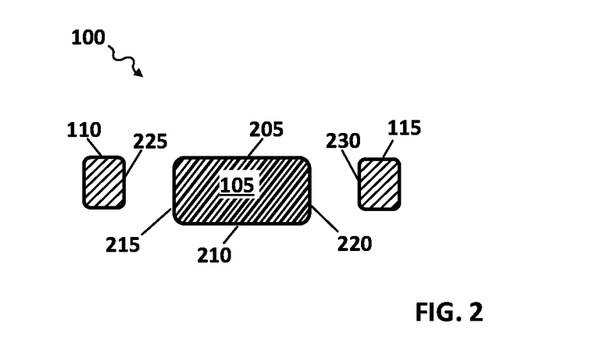
FIGS. 2-4 are schematic representations of a cross-section of the interface portion of the chuck of FIG. 1 taken along the section A-A.

FIG. 2 is a schematic representation of a cross-section of the interface portion of chuck 100 taken along the section A-A (FIG. 1). As shown, the interface portion of chuck 100 includes insulating support 105 and contact rails 110, 115. Insulating support 105 has a top surface 205, a bottom-facing surface 210, and a pair of side-facing surfaces 215, 220. Top surface 205 is generally smooth enough that semiconductor device packages can easily slide along insulating support 105, e.g., with lead frame members straddling insulating support 105. Each contact rail 110, 115 includes a respective conducting side-facing surface 225, 230.

Figure 3:
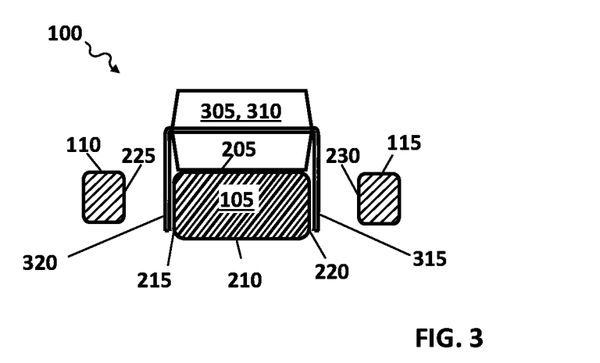

FIG. 3 is a schematic representation of a cross-section of the interface portion of chuck 100 taken along the section A-A after the interface portion of chuck 100 has been loaded with two or more semiconductor device packages 305. In the illustrated implementation, semiconductor device package 305 is represented as a dual in-line package. Each semiconductor device package 305 includes a case 310 and electrical contacts in the form of two or more lead frame members 315, 320. Case 310 is supported by top surface 205 of insulating support 105. Lead frame members 315, 320 extend downward past the top surface 205 generally adjacent side-facing surfaces 215, 220. The distance between side-facing surfaces 215, 220 (i.e., width $W_S$) can be narrow enough that packages can easily slide along the length of insulating support 105, as illustrated here. In the illustrated implementation, lead frame members 315, 320 do not extend below bottom-facing surface 210 but instead terminate along side-facing surfaces 215, 220.

Figure 4:
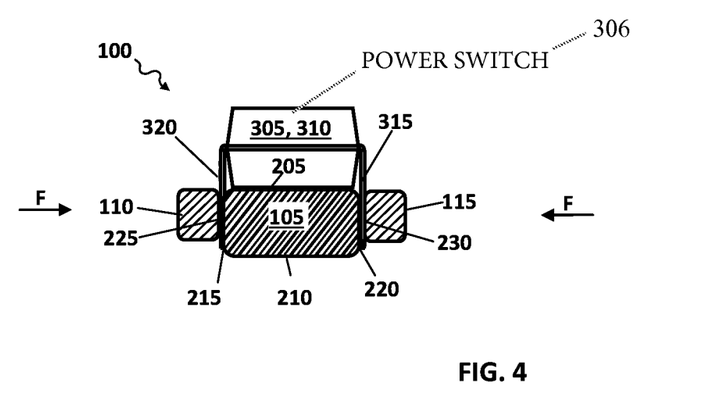

FIG. 4 is a schematic representation of a cross-section of the interface portion of chuck 100 taken along the section A-A while the interface portion of chuck 100 electrically couples with two or more semiconductor device packages 305. As shown, contact rails 110, 115 have been displaced toward insulating support 105 so that each conducting side-facing surfaces 225, 230 contacts respective of lead frame members 315, 320. In the illustrated implementation, lead frame members 315, 320 are also displaced inwardly toward insulating support 105 and come into contact with side-facing surfaces 215, 220 of insulating support 105. Insulating support 105 thus acts as a lead backer. Such contact with side-facing surfaces 215, 220 allows contact rails 110, 115 to apply relatively large forces in the directions of arrows F without risking bending of lead frame members 315, 320 and/or lifting of semiconductor device packages 305 off of insulating support 105. Such a relatively large force can help ensure that each conducting side-facing surface 225, 230 makes firm electrical contact with a respective of lead frame members 315, 320. In some implementations, side-facing surfaces 215, 220 of insulating support 105 are each coated with a respective conductive layer to further help ensure electrical contact. Examples of suitable conductive layers for side-facing surfaces 215, 220 include, e.g., metallic layers or films, metal wool layers, and layers of conductive polymers. In some implementations, the conductive layers for side-facing surfaces 215, 220 can be provided with surface roughness or other features.

With conducting side-facing surfaces 225, 230 in electrical contact with lead frame members 315, 320, isolation testing of multiple semiconductor devices can proceed. For example, in some implementations, high potential (i.e., "Hipot") electrical testing can proceed to verify, e.g., the integrity of the electrical insulation between lead frame members 315, 320 on opposite sides of multiple semiconductor device packages 305 under relatively large potential differences (e.g., potential differences in excess of 1000 Volts, e.g., potential differences in excess of 6000 Volts) between contact rails 110, 115. One example of Hipot electrical testing is Dielectric Withstanding Voltage testing in which a single test voltage is applied and the resulting leakage current is monitored. Here, the single test voltage is applied to multiple devices arranged in parallel and the resulting net leakage current is the sum of the currents in the different devices. Such net leakage current should be below a preset limit or the group of devices under test is considered to have failed. In the case of such a failure, individual testing of devices from the group can then proceed to identify which individual device(s) have failed.

In some implementations, such isolation testing can be performed on multiple integrated circuit packages that each include both a power switch 306 (e.g., a switch suitable for switching the primary current in a switched mode power supply) and components of a switching regulator suitable for regulating the switching of the power switch 306 in switched mode power supply applications. For example, in some implementations, lead fame members on one side of each integrated circuit package (i.e., to the left or right of insulating support 105 in the FIGS.) can provide electrically conductive pathways exclusively to the primary side of a switched mode power supply switch and regulator whereas lead frame members on the other side of each integrated circuit package can provide electrically conductive pathways exclusively to the secondary side of the switched mode power supply switch and regulator. Thus, the integrity of the electrical insulation between the primary side and the secondary side of multiple switched mode power supply switches and regulators can be tested at the same time, in parallel. Increased throughput can be achieved.

After testing is complete, the interface portion of chuck 100 can be returned to the state shown in FIG. 3. In particular, lead frame members 315, 320 can be released from contact with conducting side-facing surfaces 225, 230 of contact rails 110, 115 by displacing contact rails 110, 115 away from insulating support 105. Semiconductor device packages 305 can be slid off of insulating support 105 as needed.

Figure 5:
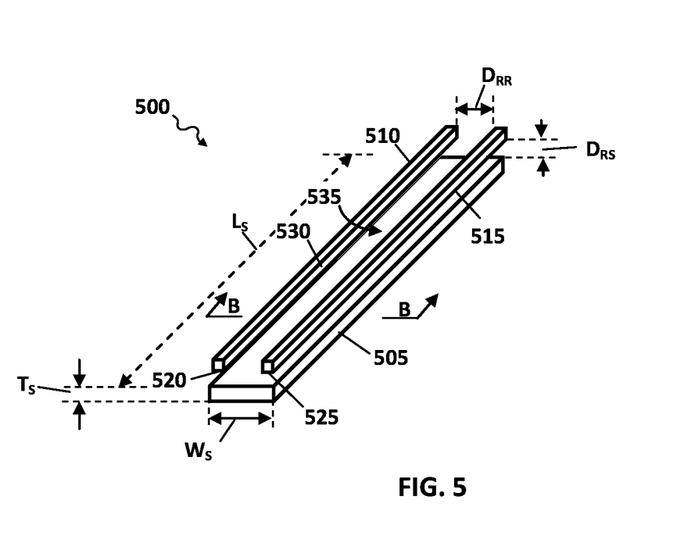
FIG. 5 is a schematic representation of the interface portion of a chuck that can be used for isolation testing of semiconductor devices.

FIG. 5 is a schematic representation of the interface portion of a chuck 500 that can be used for isolation testing of semiconductor devices. The interface portion of chuck 500 includes an insulating support 505, a first contact rail 510, and a second contact rail 515. Support 505 and contact rails 510, 515 can interface with multiple semiconductor devices to provide isolation testing in parallel.

Insulating support 505 can be a generally elongated strip-shaped member and have a length $L_S$, a width $W_S$, and a thickness $T_S$. Length $L_S$ can be several times the length of the package of semiconductor devices that are to be isolation tested in parallel using chuck 500. For example, length $L_S$ can be between two and 1000 times the length of the package, e.g., between five and 20 times the length of the package. Thickness $T_S$ is in general large enough that insulating support 505 can mechanically support the weight of the multiple semiconductor devices that are isolation tested in parallel. In some implementations, insulating support 505 is temperature controlled so that isolation testing can be conducted at a desired temperature.

In some implementations, contact rails 510, 515 are disposed at least in part above insulating support 505 during loading and unloading of semiconductor devices for isolation testing. In such implementations, contact rails 510, 515 can each include a respective bottom-facing surface 520, 525 that is disposed above insulating support 505 and separated therefrom by a distance $D_{RS}$. Also, contact rails 510, 515 can each include a respective side-facing surface 530, 535. During loading and unloading, side-facing surfaces 530 can be separated by a distance $D_{RR}$. Distances $D_{RR}$, $D_{RS}$ and width $W_S$ of insulating support 505 can be chosen in accordance with the type and the width of the packages of semiconductor devices that are to be isolation tested so that the packages can be guided by contact rails 510, 515 during sliding along insulating support 505 for loading and unloading.

Insulating support 505 is made from an insulating material. Contact rails 510, 515 can be generally elongated members and have at least one electrically conductive surface. In some implementations, contact rails 510, 515 are each mounted on one or more guide members (not shown). The guide members may be pivotable, slidable, or otherwise movable to guide contact rails 510, 515 into and out of electrical contact with multiple semiconductor devices that are isolation tested in parallel, as discussed further below.

Figure 6:
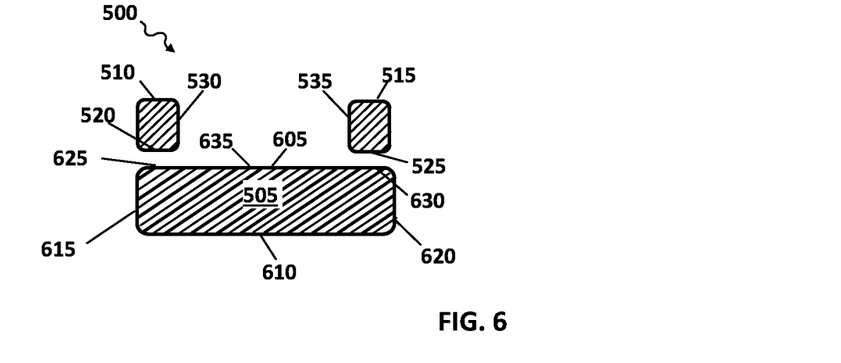
FIGS. 6-10 are schematic representations of a cross-section of the interface portion of the chuck of FIG. 5 taken along the section B-B.

FIG. 6 is a schematic representation of a cross-section of the interface portion of chuck 500 taken along the section B-B (FIG. 5). As shown, the interface portion of chuck 500 includes insulating support 505 and contact rails 510, 515. Insulating support 505 has a top surface 605, a bottom-facing surface 610, and a pair of side-facing surfaces 615, 620. Top surface 605 is generally smooth enough that semiconductor device packages can easily slide along insulating support 505. Top surface 605 includes a pair of non-central portions 625, 630 that are displaced laterally outward from a center portion 635 of top surface 605. Each contact rail 510, 515 includes a respective bottom-facing surface 520, 525 and a respective side-facing surface 530, 535. In the implementation illustrated in FIGS. 6-8, bottom-facing surfaces 520, 525 include the electrically conductive surface of contact rails 510, 515. In the implementation illustrated in FIGS. 9-10, side-facing surface 530, 535 include the electrically conductive surface of contact rails 510, 515.

Figure 7:
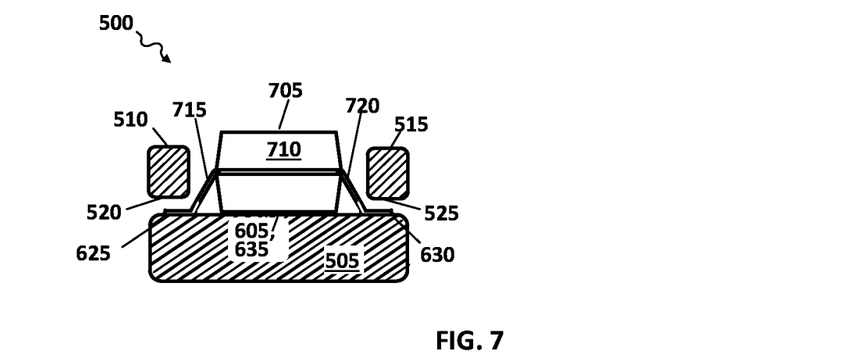

FIG. 7 is a schematic representation of a cross-section of the interface portion of chuck 500 taken along the section B-B after the interface portion of chuck 500 has been loaded with two or more semiconductor device packages 705. In the illustrated implementation, semiconductor device package 705 is represented as a surface mount package. Each semiconductor device package 705 includes a case 710 and electrical contacts in the form of two or more lead frame members 715, 720. Case 710 is supported by top surface 605 of insulating support 505. Lead frame members 715, 720 extend downward to or adjacent to the top surface 605 to positions above non-central portions 625, 630. The distance between non-central portions 625, 630 can correspond to the spacing between lead frame members 715, 720 of surface mount packages that are to be isolation tested. Thus, width $W_S$ can be wide enough to support an entire surface mount package.

Figure 8:
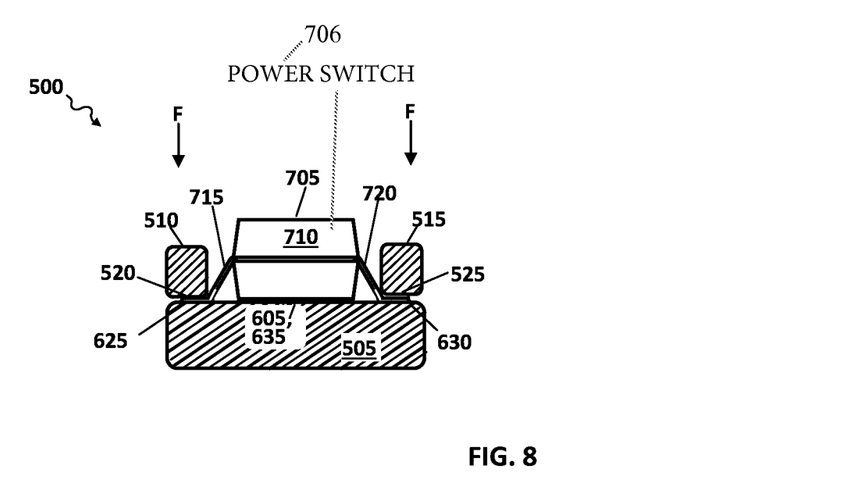

FIG. 8 is a schematic representation of a cross-section of the interface portion of chuck 500 taken along the section B-B while the interface portion of chuck 500 electrically couples with two or more semiconductor device packages 705. As shown, contact rails 510, 515 have been displaced toward insulating support 505 so that each conducting bottom-facing surface 520, 525 contacts respective of lead frame members 715, 720. If necessary, lead frame members 715, 720 are also displaced downwardly toward insulating support 505 and come into contact with non-central portions 625, 630 of insulating support 505. Insulating support 505 thus acts as a lead backer. Such contact with non-central portions 625, 630 allows contact rails 510, 515 to apply relatively large forces in the directions of arrows F without risking bending of lead frame members 715, 720. Such a relatively large force can help ensure that each conducting bottom-facing surface 520, 525 makes firm electrical contact with a respective of lead frame members 715, 720. In some implementations, non-central portions 625, 630 of insulating support 505 are each coated with a respective conductive layer to further help ensure electrical contact. Examples of suitable conductive layers for non-central portions 625, 630 include, e.g., metallic layers or films, metal wool layers, and layers of conductive polymers. In some implementations, the conductive layers for non-central portions 625, 630 can be provided with surface roughness or other features.

With conducting bottom-facing surfaces 520, 525 in electrical contact with lead frame members 715, 320, isolation testing of multiple semiconductor devices can proceed. For example, in some implementations, high potential (i.e., "Hipot") electrical testing can proceed to verify, e.g., the integrity of the electrical insulation between lead frame members 715, 720 on opposite sides of multiple semiconductor device packages 705. In some implementations, such isolation testing can be performed on multiple integrated circuit packages that each include both a power switch 706 (e.g., a switch suitable for switching the primary current in a switched mode power supply) and components of a switching regulator suitable for regulating the switching of the power switch 706 in switched mode power supply applications.

After testing is complete, the interface portion of chuck 500 can be returned to the state shown in FIG. 7. In particular, lead frame members 715, 720 can be released from contact with conducting bottom-facing surfaces 520, 525 of contact rails 510, 515 by displacing contact rails 510, 515 away from insulating support 505. Semiconductor device packages 705 can be slid off of insulating support 505 as needed, e.g., using contact rails 510, 515 and insulating support 505 as a guide.

Figure 9:
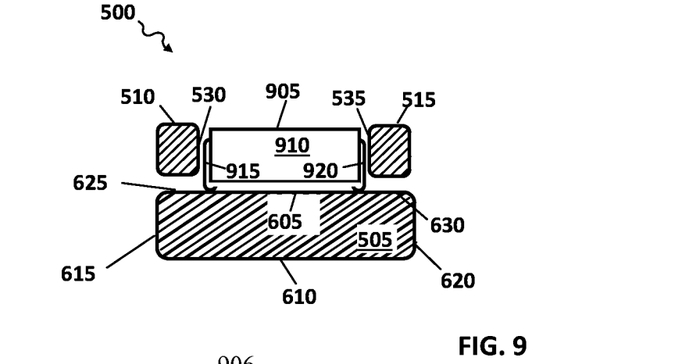

FIG. 9 is a schematic representation of a cross-section of the interface portion of chuck 500 taken along the section B-B after the interface portion of chuck 500 has been loaded with two or more semiconductor device packages 905. In the illustrated implementation, semiconductor device package 905 is represented as a J-lead package. Semiconductor device package 905 can also be, e.g., a surface mount package, dual in-line package (e.g., with leads pointing upward or "dead bug"), or a leadless package with lateral contacts.

Each semiconductor device package 905 includes a case 910 and two or more electrical contact members 915, 920. Package 905 is supported by electrical contact members 915, 920 resting on top surface 605 of insulating support 505. The distance between side-facing surfaces 530, 535 (i.e., $D_{RR}$ in FIG. 5) can be chosen so that package 905 is guided by contact rails 510, 515 when sliding along the length of insulating support 505 during loading and unloading.

Figure 10:
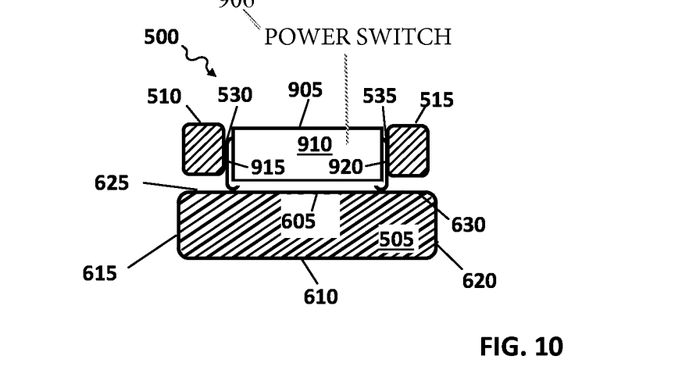

FIG. 10 is a schematic representation of a cross-section of the interface portion of chuck 500 taken along the section B-B while the interface portion of chuck 500 electrically couples with two or more semiconductor device packages 905. As shown, contact rails 510, 515 have been displaced toward the semiconductor device packages 905 so that each at least partially conducting side-facing surface 530, 535 contacts respective of electrical contact members 915, 920.

With conducting side-facing surfaces 530, 535 in electrical contact with electrical contact members 915, 920, isolation testing of multiple semiconductor devices can proceed. For example, in some implementations, high potential (i.e., "Hipot") electrical testing can proceed to verify, e.g., the integrity of the electrical insulation between electrical contact members 915, 920 on opposite sides of multiple semiconductor device packages 905. In some implementations, such isolation testing can be performed on multiple integrated circuit packages that each include both a power switch 906 (e.g., a switch suitable for switching the primary current in a switched mode power supply) and components of a switching regulator suitable for regulating the switching of the power switch 906 in switched mode power supply applications.

After testing is complete, the interface portion of chuck 500 can be returned to the state shown in FIG. 9. In particular, electrical contact members 915, 920 can be released from contact with conducting side-facing surfaces 530, 535 of contact rails 510, 515 by displacing contact rails 510, 515 away from semiconductor device packages 905 on insulating support 105. Semiconductor device packages 905 can be slid off of insulating support 505 as needed, e.g., using contact rails 510, 515 and insulating support 505 as a guide.

Figure 11:
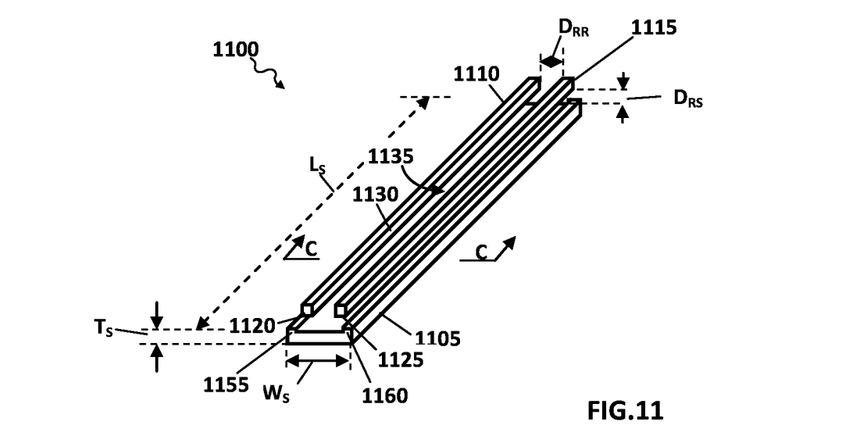
FIG. 11 is a schematic representation of the interface portion of a chuck that can be used for isolation testing of semiconductor devices.

FIG. 11 is a schematic representation of the interface portion of a chuck 1100 that can be used for isolation testing of semiconductor devices. The interface portion of chuck 100 includes an insulating support 1105, a first contact rail 1110, and a second contact rail 115. Support 1105 and contact rails 1110, 1115 can interface with multiple semiconductor devices to provide isolation testing in parallel.

Insulating support 1105 can be a generally elongated strip-shaped member and have a length $L_S$, a width $W_S$, and a thickness $T_S$. Length $L_S$ can be several times the length of the package of semiconductor devices that are to be isolation tested in parallel using chuck 1100. For example, length $L_S$ can be between two and 1000 times the length of the package, e.g., between five and 20 times the length of the package. Thickness $T_S$ is in general large enough that insulating support 1105 can mechanically support the weight of the multiple semiconductor devices that are isolation tested in parallel. In some implementations, insulating support 1105 is temperature controlled so that isolation testing can be conducted at a desired temperature.

Insulating support 1105 includes a pair of slide guides 1155, 1160. Slide guides 1155, 1160 are mechanical members disposed to guide sliding of semiconductor devices along insulating support 1105 during loading and unloading. In the illustrated implementation, slide guides 1155, 1160 are shown as longitudinal ridges integrated into respective edges of insulating support 1105. However, this is not necessarily the case. For example, in some implementations, slide guides 1155, 1160 are not part of insulating support 1105 but rather one or more discrete members. As another example, slide guides 1155, 1160 can be formed as recesses in insulating support 1105.

In some implementations, contact rails 1110, 1115 are disposed at least in part above insulating support 1105 during loading and unloading of semiconductor devices for isolation testing. In such implementations, contact rails 1110, 1115 can each include a respective bottom-facing surface 1120, 1125 that is disposed above insulating support 1105 and separated therefrom by a distance $D_{RS}$. Also, contact rails 1110, 1115 can each include a respective side-facing surface 1130, 1135. During loading and unloading, side-facing surfaces 1130, 1135 can be separated by a distance $D_{RR}$. Distances $D_{RR}$, $D_{RS}$ and width $W_S$ of insulating support 1105 can be chosen in accordance with the type and the width of the packages of semiconductor devices that are to be isolation tested so that the packages can be guided by contact rails 1110, 1115 during sliding along insulating support 1105 for loading and unloading.

Insulating support 1105 is made from an insulating material. Contact rails 1110, 1115 can be generally elongated members and have at least one electrically conductive surface. In some implementations, contact rails 1110, 1115 are each mounted on one or more guide members (not shown). The guide members may be pivotable, slidable, or otherwise movable to guide contact rails 1110, 1115 into and out of electrical contact with multiple semiconductor devices that are isolation tested in parallel, as discussed further below.

Figure 12:
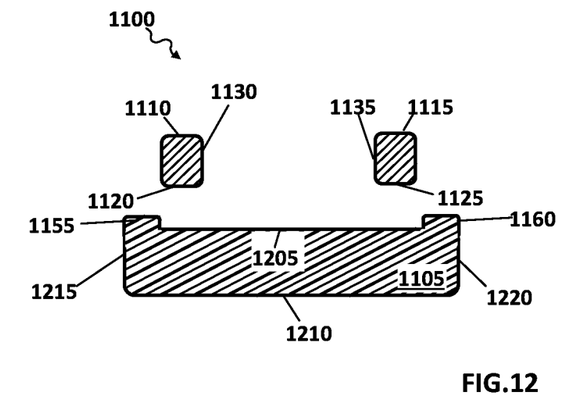
FIGS. 12-14 are schematic representations of a cross-section of the interface portion of chuck of FIG. 11 taken along the section C-C.

FIG. 12 is a schematic representation of a cross-section of the interface portion of chuck 1100 taken along the section C-C (FIG. 11). As shown, the interface portion of chuck 1100 includes insulating support 1105 and contact rails 1110, 1115. Insulating support 1105 has a top surface 1205, a bottom-facing surface 1210, and a pair of side-facing surfaces 1215, 1220. Top surface 1205 is generally smooth enough that semiconductor device packages can easily slide along insulating support 1105. Each contact rail 1110, 1115 includes a respective bottom-facing surface 1120, 1125 and a respective side-facing surface 1130, 1135. In the implementation illustrated in FIGS. 12-14, bottom-facing surfaces 1120, 1125 include the electrically conductive surface of contact rails 1110, 1115. In other implementations, side-facing surface 1130, 1135 include the electrically conductive surface of contact rails 1110, 1115.

Figure 13:
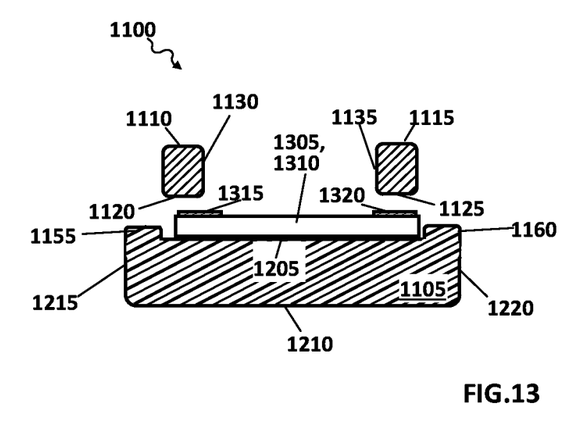

FIG. 13 is a schematic representation of a cross-section of the interface portion of chuck 1100 taken along the section C-C after the interface portion of chuck 1100 has been loaded with two or more semiconductor device packages 1305. In the illustrated implementation, semiconductor device package 1305 is represented as a leadless package with bottom contacts (here shown with the contacts up or "dead bug"). Each semiconductor device package 1305 includes a case 1310 and two or more electrical contact members 1315, 1320. Case 1310 is supported by top surface 1205 of insulating support 1105. The distance between bottom-facing surfaces 1120, 1125 can correspond to the spacing between electrical contact members 1315, 1320 of packages that are to be isolation tested. Width $W_S$ can be wide enough to support an entire surface mount package between slide guides 1155, 1160.

Figure 14:
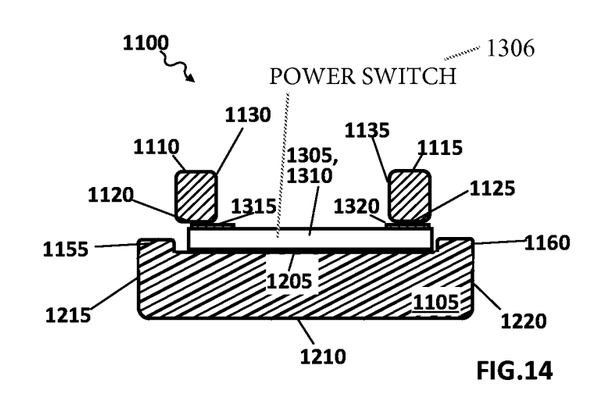

FIG. 14 is a schematic representation of a cross-section of the interface portion of chuck 1100 taken along the section C-C while the interface portion of chuck 1100 electrically couples with two or more semiconductor device packages 1305. As shown, contact rails 1110, 1115 have been displaced toward insulating support 1105 so that each conducting bottom-facing surface 1120, 1125 contacts respective of contact members 1315, 1320.

With conducting bottom-facing surfaces 1120, 1125 in electrical contact with contact members 1315, 1320, isolation testing of multiple semiconductor devices can proceed. For example, in some implementations, high potential (i.e., "Hipot") electrical testing can proceed to verify, e.g., the integrity of the electrical insulation between contact members 1315, 1320 on opposite sides of multiple semiconductor device packages 1305. In some implementations, such isolation testing can be performed on multiple integrated circuit packages that each include both a power switch 1306 (e.g., a switch suitable for switching the primary current in a switched mode power supply) and components of a switching regulator suitable for regulating the switching of the power switch 1306 in switched mode power supply applications.

After testing is complete, the interface portion of chuck 1100 can be returned to the state shown in FIG. 13. In particular, contact members 1315, 1320 can be released from contact with conducting bottom-facing surfaces 1120, 1125 of contact rails 1110, 1115 by displacing contact rails 1110, 1115 away from insulating support 1105. Semiconductor device packages 1305 can be slid off of insulating support 1105 as needed, e.g., using slide guides 1155, 1160 and insulating support 1105 as a guide.

Figure 15:
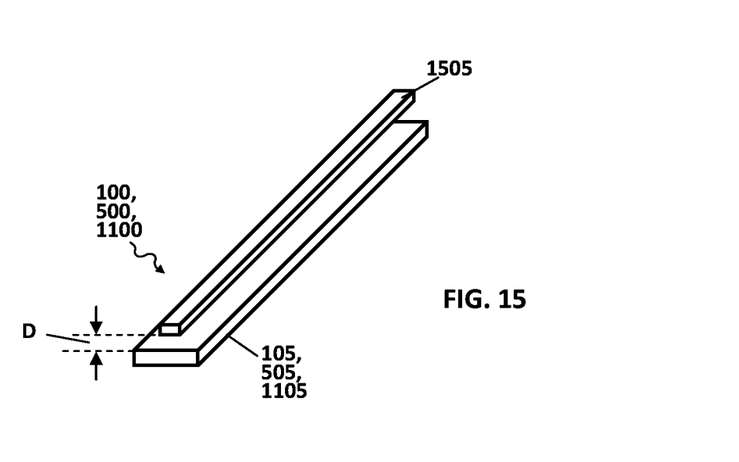
FIG. 15 is a schematic representation of the interface portion of a chuck such as chuck that includes a slide guide.

FIG. 15 is a schematic representation of the interface portion of a chuck such as chuck 100, 500, 1100 that can be used for isolation testing of semiconductor devices. The interface portion of chuck includes a slide guide 1505. Slide guide 1505 is a mechanical member disposed to guide sliding of semiconductor devices along an insulating support (e.g., insulating supports 105, 505, 1105) during loading and unloading. In some implementations, slide guide 1505 can be disposed a distance D away from a top surface of an insulating support (e.g., top surfaces 205, 605, 1205) to ensure that the packages of semiconductor devices do not depart too far from the top surface of an insulating support when sliding during loading and unloading. Distance D can thus be appropriate for the size of the packages that are to be isolation tested.

Figure 16:
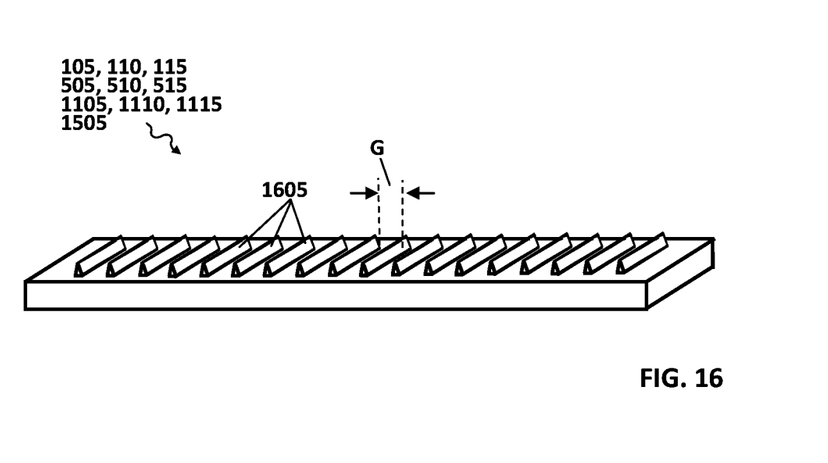
FIG. 16 is a schematic representation of one implementation of an insulating support, a contact rail, and/or a slide guide that can be used for isolation testing of semiconductor devices.

FIG. 16 is a schematic representation of one implementation of an insulating support, a contact rail, and/or a slide guide that can be used for isolation testing of semiconductor devices in chucks such as chuck 100, 500, 1100. As shown, an insulating support, a contact rail, and/or a slide guide can include one or more isolation members 1605. Isolation members 1605 are electrically insulating members. When two or more isolation members 1605 are present, opposing faces of isolation members 1605 can be separated by a gap G that approximates the length of the package of the semiconductor device that are to be isolation tested. Isolation members 1605 can thus help insure that shorts between dambars of adjacent packages do not short during isolation testing.

In some implementations, isolation members 1605 are moveable members that are insertable between adjacent packages in series, with the insertion of one isolation member 1605 sliding multiple packages along an insulating support to an appropriate position for insertion of a next isolation member 1605.

The invention claimed is:

1. A method comprising:
loading packaged semiconductor devices onto an insulating support, the packaged semiconductor devices each having a plurality of electrical contacts, wherein loading the packaged semiconductor devices comprises sliding the packaged semiconductor devices along a surface of the insulating support;
contacting some of the electrical contacts of multiple of the packaged semiconductor devices supported by the insulating support with a first electrically conductive surface disposed on a first elongated rail; and
contacting some of the electrical contacts of multiple of the packaged semiconductor devices supported by the insulating support with a second electrically conductive surface disposed on a second elongated rail.

2. The method of claim 1, further comprising guiding the sliding of the packaged semiconductor devices along the surface of the insulating support.

3. The method of claim 1, further comprising isolation testing the packaged semiconductor devices supported by the insulating support in parallel using the first electrically conductive surface and the second electrically conductive surface.

4. The method of claim 1, wherein contacting some of the electrical contacts with the first electrically conductive surface comprises contacting two or more contacts of each of the multiple packaged semiconductor devices with the first electrically conductive surface.

5. The method of claim 4, wherein the two or more contacts provide electrically conductive pathways from the first electrically conductive surface exclusively to a primary side or a secondary side of a switched mode power supply switch.

6. The method of claim 4, wherein contacting some of the electrical contacts with the second electrically conductive surface comprises contacting two or more contacts of each of the multiple packaged semiconductor devices with the second electrically conductive surface.

7. The method of claim 6, wherein:
the two or more contacts contacted with the first electrically conductive surface provide electrically conductive pathways exclusively to a primary side of a switched mode power supply switch; and
the two or more contacts contacted with the second electrically conductive surface provide electrically conductive pathways exclusively to a secondary side of the switched mode power supply switch.

8. A chuck for holding packaged semiconductor devices during isolation testing, the chuck comprising:
an interface portion for making electrical contact with the packaged semiconductor devices under test, the interface portion comprising
an insulating support configured and dimensioned to support multiple semiconductor device packages, each semiconductor device package having a plurality of electrical contacts,
a slide guide configured and disposed to guide sliding of the packaged semiconductor devices along the insulating support to and from testing positions,
a first electrically conductive surface disposed on a first elongated rail to electrically contact a first proper subset of the plurality of electrical contacts of each of the semiconductor device packages supported by the interface portion, and
a second electrically conductive surface disposed on a second elongated rail to electrically contact a second proper subset of the plurality of electrical contacts of each of the semiconductor device packages supported by the insulating support.

9. The chuck of claim 8, wherein the slide guide is an integral part of the insulating support.

10. The chuck of claim 8, wherein:
the first electrically conductive surface disposed on the first elongated rail is moveable in and out of electrical contact with the first proper subset of the plurality of electrical contacts; and
the second electrically conductive surface disposed on the second elongated rail is moveable in and out of electrical contact with the second proper subset of the plurality of electrical contacts.

11. The chuck of claim 8, wherein:
the electrical contacts of each of the first proper subsets are all on a first side of a respective of the semiconductor device packages; and
the electrical contacts of each of the second proper subsets are all on a second side of a respective of the semiconductor device packages.

12. The chuck of claim 11, wherein:
the electrical contacts of each of the first proper subsets are all the electrical contacts on the first side; and
the electrical contacts of each of the second proper subsets are all the electrical contacts on the second side.

13. The chuck of claim 8, wherein:
the first and second electrically conductive surfaces disposed on the first and second elongated rails are moveable to electrically contact the first and second proper subsets.

14. The chuck of claim 13, wherein:
the electrical contacts of each of the semiconductor device packages are lead frame members; and
the insulating support is disposed to act as a backer that mechanically supports the electrical contact with the lead frame members.

15. The chuck of claim 8, wherein the insulating support further comprises:
- a first electrically conductive surface to electrically contact the first proper subset of the plurality of electrical contacts of each of the supported semiconductor device packages; and
- a second electrically conductive surface to electrically contact the second proper subset of the plurality of electrical contacts of each of the supported semiconductor device packages.

16. A chuck for holding packaged semiconductor devices during isolation testing, the chuck comprising:
- an interface portion for making electrical contact with multiple semiconductor device packages under test, the interface portion including
  - a first electrically conductive surface disposed on a first elongated rail moveable into and out of electrical contact with a first proper subset of a plurality of electrical contacts of each of the multiple semiconductor device packages, and
  - a second electrically conductive surface disposed on a second elongated rail moveable into and out of electrical contact with a second proper subset of a plurality of electrical contacts of each of the multiple semiconductor device packages,
  - wherein the first and second elongated rails are moveable into and out of electrical contact with electrical contacts of multiple semiconductor device packages that are disposed in a generally linear arrangement.

17. The chuck of claim 16, wherein:
- the first proper subset of the plurality of electrical contacts includes all of the electrical contacts on first sides of the multiple semiconductor devices; and
- the second proper subset of the plurality of electrical contacts includes all of the electrical contacts on second sides of the multiple semiconductor devices.

18. The chuck of claim 16, wherein:
- the first and the second electrically conductive surfaces are flexible conductive surfaces.

19. The chuck of claim 16, wherein:
- the electrical contacts of each of the first proper subsets are all the electrical contacts on the first side; and
- the electrical contacts of each of the second proper subsets are all the electrical contacts on the second side.

20. The chuck of claim 16, wherein the interface portion further comprises an insulating support configured and dimensioned to support the multiple semiconductor device packages under test.

21. The chuck of claim 20, wherein:
- the electrical contacts of each of the semiconductor device packages are lead frame members; and
- the insulating support is disposed to act as a backer that mechanically supports the electrical contact with the lead frame members.

22. The chuck of claim 20, wherein the insulating support further comprises:
- a first electrically conductive surface to electrically contact the first proper subset of the plurality of electrical contacts of each of the supported semiconductor device packages; and
- a second electrically conductive surface to electrically contact the second proper subset of the plurality of electrical contacts of each of the supported semiconductor device packages.

23. A chuck for holding packaged semiconductor devices during isolation testing, the chuck comprising:
- an interface portion for making electrical contact with the packaged semiconductor devices under test, the interface portion including
  - an elongated insulating support configured and dimensioned to support multiple semiconductor device packages, and
  - a slide guide configured and disposed to guide sliding of semiconductor device packages along the elongated insulating support to and from positions at which electrical contact is made to the semiconductor device packages during testing, wherein the slide guide includes an electrically conductive surface for contacting the packaged semiconductor devices under test.

24. The chuck of claim 23, wherein the slide guide is integral with the elongated insulating support.

* * * * *